United States Patent
Yonezawa

(10) Patent No.: US 7,308,381 B2
(45) Date of Patent: Dec. 11, 2007

(54) TIMING VERIFICATION METHOD FOR SEMICONDUCTOR INTEGRATED CIRCUIT

(75) Inventor: Hirokazu Yonezawa, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/495,778

(22) Filed: Jul. 31, 2006

(65) Prior Publication Data

US 2007/0050742 A1  Mar. 1, 2007

(30) Foreign Application Priority Data

Aug. 31, 2005 (JP) ............. 2005-250942

(51) Int. Cl.
*G06F 1/12* (2006.01)
(52) U.S. Cl. ............ 702/179; 702/125; 702/79; 702/69; 702/189; 713/500; 713/503; 716/6; 714/731; 714/744
(58) Field of Classification Search ........... 702/179, 702/124, 125
See application file for complete search history.

(56) References Cited

U.S. PATENT DOCUMENTS 6,915,497 B2 * 7/2005 Kitahara ............... 716/6
7,075,336 B2 * 7/2006 Kojima et al. ............ 326/93
2004/0167756 A1 * 8/2004 Yonezawa ................. 703/2

FOREIGN PATENT DOCUMENTS

| JP | 10-301982 | 11/1998 |
| JP | 2967759 | 8/1999 |
| JP | 2005-259107 | 9/2005 |
| WO | WO 03/060776 A1 | 7/2003 |

OTHER PUBLICATIONS

K.A. Bowman et al., "Impact of *Within-Die* Parameter Fluctuations on Future Maximum Clock Frequency Distributions," Custom Integrated Circuits Conference (2001), no month.

* cited by examiner

*Primary Examiner*—Hal Wachsman
(74) *Attorney, Agent, or Firm*—McDermott Will & Emery LLP

(57) ABSTRACT

Initially, non-uniformity of statistical skews between a plurality of clock output terminal pairs is calculated. Next, a partial circuit driven by a clock output terminal pair having each skew distribution is extracted from an integrated circuit. Next, a second statistical timing characteristic which is a maximum value in the partial circuit is obtained from a first statistical timing characteristic of signal paths included in the extracted partial circuit. Next, timing verification for the integrated circuit is performed using the second statistical timing characteristics corresponding to the respective statistical clock skews.

11 Claims, 11 Drawing Sheets

TIMING VERIFICATION METHOD FOR SEMICONDUCTOR INTEGRATED CIRCUIT

CROSS REFERENCE TO RELATED APPLICATIONS

This Non-provisional application claims priority under 35 U.S.C. §119(a) on Patent Application No. 2005-250942 filed in Japan on Aug. 31, 2005, the entire content of which is hereby incorporated by reference.

BACKGROUND OF THE INVENTION

1. Field of the Invention

The present invention relates to a timing verification method for evaluating a variation in a timing characteristic of an integrated circuit due to a variation during manufacture when designing a semiconductor integrated circuit, particularly an LSI (Large Scale Integrated Circuit) or the like.

2. Description of the Related Art

In recent years, the size of transistors has been reduced with the development of LSI manufacturing technology, so that the packaging density of LSIs has been rapidly increased. Therefore, various functions can now be incorporated into, for example, a CMIS (Complementary Metal Insulator Semiconductor) semiconductor integrated circuit.

LSIs are designed to meet a specification of various circuit characteristics. Among other things, care is needed in designing the timing of a circuit. In general, when a signal is propagated in a circuit, a delay occurs in the propagation of the signal. The timing of the circuit is designed so that the propagation delay falls within a specified range. Typically, the signal timing is verified during design of the timing.

Timing verification is a technique of virtually reproducing timing characteristics (delay characteristics) of a circuit by computer software, and is widely used so as to, for example, confirm an operation during design of the circuit. Among other things, the software sold under the trademark PRIME-TIME (Synopsys, Inc., USA) or the like is known as representative timing verification software. The timing verification software can evaluate timing characteristics of both a clock circuit and a circuit driven according to the clock circuit.

A circuit is designed so as to operate normally even when the circuit is affected by various factors of variation or fluctuation which have an influence on circuit characteristics of the circuit. There are various factors to be considered, including a variation and a fluctuation during manufacture. The manufacture variation occurs in, for example, process dimensions during a lithography step or a polishing step, a dopant density of a diffusion region, and the like. When the manufacture variation occurs, electrical characteristics of a transistor and an interconnect in a circuit vary, so that circuit characteristics of an LSI including the transistor and the interconnect also vary. Thus, as the size of devices is rapidly reduced, an influence of the manufacture variation on circuit characteristics is becoming more and more significant.

A clock signal is an important signal which synchronizes internal operations of an LSI. Delicate care is needed to design timing of a clock circuit which supplies the clock signal.

FIG. 14 illustrates an exemplary conventional clock tree circuit. A clock signal is supplied from an input terminal I via a plurality of circuit cells (buffers) C1, C2, . . . , and C7 (called a clock tree) to output terminals O1 to O4. Typically, the output terminals O1 to O4 are connected to flip-flop circuits FF1 to FF4. Delays occur in the clock signal until the clock signal reaches from the input terminal I to the output terminals O1 to O4, i.e., when the clock signal is passed through the circuit cells C1 to C7 and interconnections. A difference in delay between each of the output terminals O1 to O4 is a clock skew (hereinafter simply referred to as a skew).

FIG. 15 illustrates a conventional circuit connection configuration including a clock tree circuit, flip-flop circuits, and signal paths.

In timing verification, a relationship between the following expressions (1) and (2) is verified.

$$T_{path(max)} + T_{skew} + T_{setup} \leq T_{cycle} \tag{1}$$

$$T_{path(min)} - T_{skew} \geq T_{hold} \tag{2}$$

On a setup time side indicated with expression (1), it is verified for each signal path whether or not a value obtained by adding a maximum signal path delay $T_{path(max)}$, a skew $T_{skew}$, and a setup time $T_{setup}$ falls within a clock cycle $T_{cycle}$. This is herein referred to as "setup time margin verification". Although a minimum signal path delay can be used on the setup time side, setup time margin verification which employs the maximum signal path delay, which generally tends to cause a problem, will be hereinafter described.

On a hold time side indicated with expression (2), it is verified for each signal path whether or not a value obtained by subtracting the skew $T_{skew}$ from a minimum signal path delay $T_{path(min)}$ is greater than or equal to a hold time $T_{hold}$. This is herein referred to as "hold time margin verification". Although the maximum signal path delay can be used on the hold time side, hold time margin verification which employs the minimum signal path delay, which generally tends to cause a problem, will be hereinafter described. The setup time refers to a time required to determine a value of an input signal a predetermined time or more before time of an edge of a clock signal so that the flip-flop circuits FF1 to FF4 can take in the input signal in synchronization with the edge of the clock signal. The hold time refers to a time during which a value of an input signal does not vary, so as to hold the input signal, the time being a predetermined time or more from the time of the edge of the clock signal.

A large skew would cause a circuit to malfunction. Therefore, a tolerable skew range is set as a design margin, and verification of whether or not the tolerable range is satisfied is performed in a timing designing step during design. A delay value of a clock signal path is obtained for each clock output terminal, a difference between each of the obtained delays is calculated as a skew for each pair of clock output terminals, and it is confirmed whether or not the calculated skew falls within the tolerable range, i.e., a maximum skew falls within the tolerable range.

The skew varies due to a manufacture variation. The manufacture variation is roughly divided into an inter-chip variation component and an in-chip variation component. The skew is calculated as a difference between delays of two signal paths. Therefore, if a variation is assumed to be uniform in a chip, the inter-chip variation component has a small influence on a variation in the skew. In contrast to this, the in-chip variation (a.k.a. intra-chip or within-die variation) component in a chip causes different variations on two signal paths in the chip, resulting in an increase or decrease in the skew, and therefore, needs to be sufficiently considered during timing verification.

Therefore, assuming that there are no variations in delay, a delay is obtained for each path. A delay for each pair of paths is multiplied by a different coefficient to produce a skew, assuming an in-chip variation. The resultant skew is used for timing verification.

There are also known techniques described in JP 2967759 B (Patent Document 1) and International Publication WO2003/060776 (Patent Document 2) described below.

According to Patent Document 1, a skew of a clock tree circuit is obtained as follows. The tree is tracked back from clock output terminals toward upstream of the tree, to find a node where tree branches are merged. A skew is obtained from delay times from the node to clock output terminals, taking a manufacture variation into consideration. The skew is used for timing verification.

According to Patent Document 2, when a signal path delay is calculated, an effect that an in-chip variation is attenuated along a path is taken into consideration.

Note that not only the clock skew but also the signal path delay are affected by a manufacture variation. In this case, the signal path delay may be obtained by the following expressions (3) and (4).

$$T_{path} = \Sigma(t_{typ} \cdot K_p) \quad (3)$$

$$T_{path} = \Sigma(t_{max}) \quad (4)$$

Expression (3) indicates a method for obtaining a maximum delay and a minimum delay on a signal path by obtaining delay elements $t_{typ}$ of a circuit cell and an interconnect with the assumption that there is not a manufacture variation, and multiplying the delay elements by a coefficient $K_p$ with the assumption of a manufacture variation.

Expression (4) indicates a method for obtaining a maximum signal path delay from the sum of maximum delay elements $t_{max}$ which are previously obtained, taking a manufacture variation into consideration. A minimum signal path delay can also be similarly obtained.

Also, there is a known technique described in, for example, K. A. Bowman and J. D. Meindl, "Impact of Within-Die Parameter Fluctuations on Future Maximum Clock Frequency Distributions," Custom Integrated Circuits Conference (2001) (Non-Patent Document). A chip typically includes a number of signal paths, and among other things, a critical path group having a small timing margin determines performance of the chip. According to the Non-Patent Document, the signal path delay is not handled in units of a path as in expressions (3) and (4), and the critical path group in a chip is handled, thereby statistically obtaining a maximum delay of the whole chip when an influence of an in-chip variation is taken into consideration.

However, the calculation method disclosed in Patent Document 1 includes the step of calculating a clock tree skew, taking an in-chip variation into consideration, but is an approximation method in which a delay is multiplied by a coefficient representing the in-chip variation. In this method, neither a delay on a clock signal path nor a skew after calculation is handled as a statistical amount. Therefore, the influence of a manufacture variation on a skew can be only limitedly evaluated. Also, a delay on a signal path other than the clock tree is not statistically handled. Since the manufacture variation is statistically represented, it is desirable that both the delay and the skew, which are affected by the manufacture variation, be appropriately handled as statistical amounts.

In Patent Document 2, although the effect that an in-chip variation is averaged and attenuated along a path is provided, a correlation relationship between path delays, which is important when a delay difference, such as a clock skew or the like, is considered, is not taken into consideration.

In the Non-Patent Document, although a technique of statistically and analytically obtaining a delay which represents a whole chip circuit including a plurality of signal paths, taking an in-chip variation into consideration, is described, a method in which a characteristic of a clock skew is taken into consideration as well is not described.

Thus, all of the above-described conventional methods disadvantageously have difficulty in achieving appropriate timing verification and a low level of reliability, though highly reliable timing verification is highly demanded.

SUMMARY OF THE INVENTION

In view of the above-described conventional problems, an object of the present invention is to improve reliability of timing verification in which a variation in a semiconductor integrated circuit is taken into consideration.

To achieve the object, the present invention provides a timing verification method for a semiconductor integrated circuit in which variations in both a clock skew and a signal path delay due to a manufacture variation are statistically taken into consideration.

Specifically, according to a first aspect of the present invention, a method for performing timing verification for a semiconductor integrated circuit is provided. The semiconductor integrated circuit comprises a clock circuit capable of outputting a plurality of clock signals, and an integrated circuit including a plurality of signal paths to which any of the plurality of clock signals output from the clock circuit is supplied. Variations in the plurality of clock signals in the semiconductor integrated circuit are taken into consideration. The method comprises the steps of (a) obtaining a plurality of statistical clock skews by statistically calculating a clock skew occurring between each pair of any clock signals of the plurality of clock signals, (b) extracting from the integrated circuit a partial circuit driven by a clock signal pair in which one of the plurality of statistical clock skews occurs, (c) calculating a first statistical timing characteristic of signal paths included in the extracted partial circuit, (d) obtaining at least one of a maximum value and a minimum value of the calculated first statistical timing characteristic as a second statistical timing characteristic, and (e) performing timing verification for the signal paths included in the partial circuit using the obtained second statistical timing characteristic.

According to the semiconductor integrated circuit timing verification method of the first aspect of the present invention, after a plurality of statistical clock skews are obtained, a partial circuit driven by a clock signal pair in which one of the obtained plurality of statistical clock skews occurs is extracted from the integrated circuit. Thereafter, a first statistical timing characteristic of signal paths included in the extracted partial circuit is calculated. At least one of a maximum value and a minimum value of the calculated first timing characteristic is obtained as a second statistical timing characteristic. The second statistical timing characteristic is used to perform timing verification for the signal paths included in the partial circuit. Thereby, highly reliable timing verification can be performed, taking a variation into consideration.

In the semiconductor integrated circuit timing verification method of the first aspect of the present invention, preferably, a delay probability distribution of each of the signal paths is used as the first statistical timing characteristic in the step (c), a maximum delay probability distribution of all the signal paths included in the partial circuit is used as the second statistical timing characteristic; in the step (d), and setup time margin timing verification or hold time margin timing verification is performed for the partial circuit using the maximum delay probability distribution in the step (e).

In the semiconductor integrated circuit timing verification method of the first aspect of the present invention, preferably, a delay probability distribution of each of the signal paths is used as the first statistical timing characteristic in the step (c), a minimum delay probability distribution of all the signal paths included in the partial circuit is used as the second statistical timing characteristic in the step (d), and setup time margin timing verification or hold time margin timing verification is performed for the partial circuit using the minimum delay probability distribution in the step (e).

In the semiconductor integrated circuit timing verification method of the first aspect of the present invention, preferably, in the step (b), when statistical clock skew values occurring between the pairs of any clock signals are the same or equivalent, and a coefficient of correlation between the statistical clock skew values is substantially 1, a plurality of partial circuits connected to the clock signal pairs having the same or equivalent statistical clock skew value are collectively extracted.

In the semiconductor integrated circuit timing verification method of the first aspect of the present invention, preferably, in the step (b), a limitation is put on a delay on each of the signal paths and the number of gates on each of the signal paths, and a partial circuit including a signal path satisfying the limitation is extracted from the integrated circuit.

In the semiconductor integrated circuit timing verification method of the first aspect of the present invention, preferably, the method further comprises (f) obtaining a variation in a signal waveform of each of the plurality of clock signals before the step (a). In the step (c), the first statistical timing characteristic in which the signal waveform variation of each of the clock signals is reflected, is calculated.

In the semiconductor integrated circuit timing verification method of the first aspect of the present invention, preferably, in the step (a), the statistical clock skew is calculated, taking into consideration at least one factor of a manufacture variation, a voltage variation, and a temperature variation.

In the semiconductor integrated circuit timing verification method of the first aspect of the present invention, preferably, the step (a) includes obtaining as a coefficient at least one factor of a manufacture variation, a voltage variation, and a temperature variation, and multiplying the statistical clock skew by the obtained coefficient.

In the semiconductor integrated circuit timing verification method of the first aspect of the present invention, preferably, in the step (c), the first statistical timing characteristic is calculated, taking into consideration at least one factor of a manufacture variation, a voltage variation, and a temperature variation.

In the semiconductor integrated circuit timing verification method of the first aspect of the present invention, preferably, the step (c) includes obtaining as a coefficient at least one factor of a manufacture variation, a voltage variation, and a temperature variation, and the step (d) includes multiplying the second statistical timing characteristic by the obtained coefficient.

According to a second aspect of the present invention, a method is provided for performing timing verification for a semiconductor integrated circuit. The semiconductor integrated circuit comprises a clock circuit capable of outputting a plurality of clock signals, and an integrated circuit including a plurality of signal paths to which any of the plurality of clock signals output from the clock circuit is supplied. Variations in the plurality of clock signals in the semiconductor integrated circuit are taken into consideration. The method comprises a clock skew classifying step (a) of specifying expected clock skew types based on a circuit topology of the clock circuit, and associating clock skews with clock signal pairs having the specified clock skews, a clock skew distribution calculating step (b) of statistically calculating a probability distribution of a clock skew for each clock skew type, a signal path classifying step (c) of extracting and classifying as a partial circuit a signal path driven by the clock signal pair from the integrated circuit for each probability distribution type of the clock skew, a signal path group delay distribution calculating step (d) of calculating probability distributions of delays of all signal paths included in the partial circuit for each extracted partial circuit, and a timing verifying step (e) of performing timing verification based on at least one of a maximum delay and a minimum delay of the probability distributions of the delays of all the signal paths included in the partial circuit, and the probability distribution of the clock skew.

According to the semiconductor integrated circuit timing verification method of the second aspect of the present invention, a probability distribution of a clock skew is statistically calculated for each clock skew type, and thereafter, a signal path driven by a clock signal pair is extracted and classified as a partial circuit from the integrated circuit for each clock skew probability distribution type. Thereafter, probability distributions of delays of all signal paths included in each extracted partial circuit are calculated. At least one of a maximum delay and a minimum delay of the probability distributions of the delays of all the signal paths included in the extracted partial circuit and the clock skew probability distribution are used to perform timing verification. Thereby, highly reliable timing verification can be performed, taking a variation into consideration.

BRIEF DESCRIPTION OF THE DRAWINGS

FIG. 4A is a graph indicating a first partial circuit $\alpha$, and FIG. 4B is a graph indicating a second partial circuit $\beta$.

FIG. 5A is a graph illustrating probability distributions on the left sides of expressions (8)

and (9). FIG. 5B is a graph illustrating cumulative probability distributions on the left sides of expressions (8) and (9).

FIG. 11A is a graph indicating a first partial circuit α, and FIG. 11B is a graph indicating a second partial circuit β.

DETAILED DESCRIPTION OF THE PREFERRED EMBODIMENTS

First Embodiment

A timing verification method according to a first embodiment of the present invention will be described with reference to the accompanying drawings.

Figure 1:
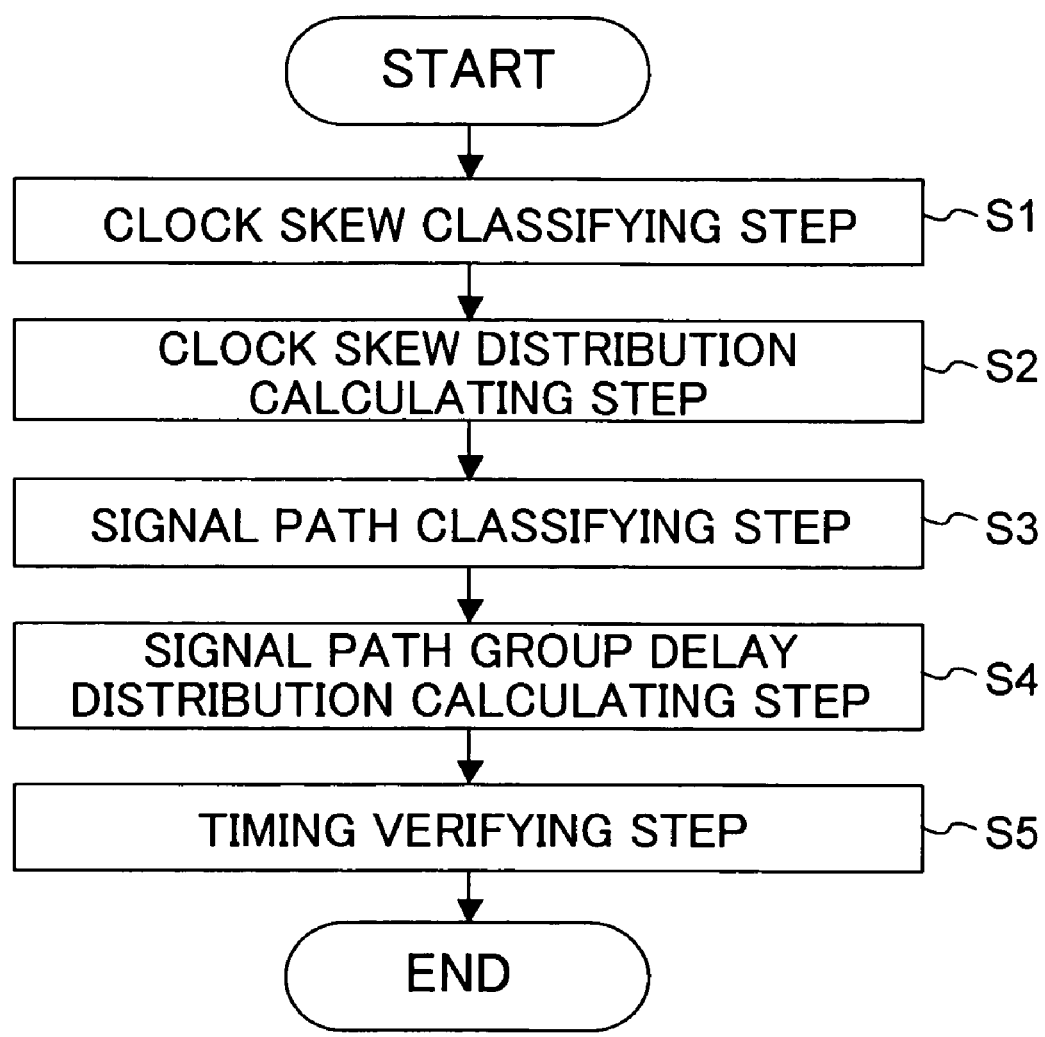
FIG. 1 is a step flow diagram illustrating a semiconductor integrated circuit timing verification method according to a first embodiment of the present invention.

FIG. 1 illustrates a step flow of the semiconductor integrated circuit timing verification method of the first embodiment of the present invention, including a clock skew classifying step S1, a clock skew distribution calculating step S2, a signal path classifying step S3, a signal path group delay distribution calculating step S4, and a timing verifying step S5.

(Clock Skew Classifying Step S1)

Firstly, an idea of handling a skew as a statistical amount using a simple model, and a difference occurring between skew distributions, will be described.

Figure 2A:
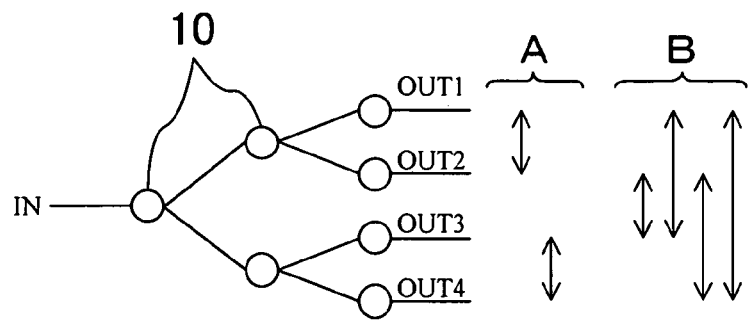
FIG. 2A is a diagram illustrating a clock tree circuit to be handled by the semiconductor integrated circuit timing verification method of the first embodiment of the present invention and combinations of clock signal terminals of the clock tree circuit.

As illustrated in FIG. 2A, for example, a clock tree circuit is assumed in which a plurality of circuit cells 10, each of which is a buffer having the same configuration, are connected, and all paths from a clock input terminal IN to clock output terminals OUT1 to OUT4 have the same delay distribution, average and standard deviation. Note that flip-flop circuits which are connected to the clock output terminals OUT1 to OUT4 are not illustrated in FIG. 2A, for the sake of simplicity.

In the clock tree circuit, due to an influence of a manufacture variation, two types of probability distributions A and B of skew (hereinafter referred to as skew distributions) may occur. Here, when delay distributions of clock signal paths i and j are represented by normal distributions $N(\mu_i, \sigma_i^2)$ and $N(\mu_j, \sigma_j^2)$, a skew distribution $N(\mu, \sigma^2)$ is represented by expressions (5) and (6) based on a difference in delay between both the paths, where μ indicates an average value, σ indicates a standard deviation, and ρ is a correlation coefficient.

$$\mu = \mu_i - \mu_j \qquad (5)$$

$$\sigma^2 = \sigma_i^2 + \sigma_j^2 - 2\rho_{ij}\sigma_i\sigma_j \qquad (6)$$

The circuit of FIG. 2A includes four clock signal paths, and therefore, there are a total of six combinations of pairs of two paths selected among the four paths. However, since all of the paths are assumed to have a delay distribution having the same average and standard deviation, only two skew distributions need to be considered. In addition, here, the skew distribution of expression (5) has an average value (mean value) μ of 0.

Figure 2B:
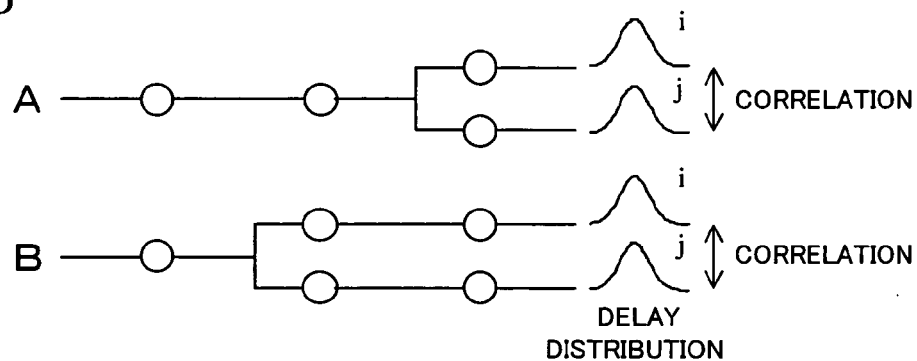
FIG. 2B is a diagram illustrating a correlation in delay between clock signal paths.
Figure 2C:
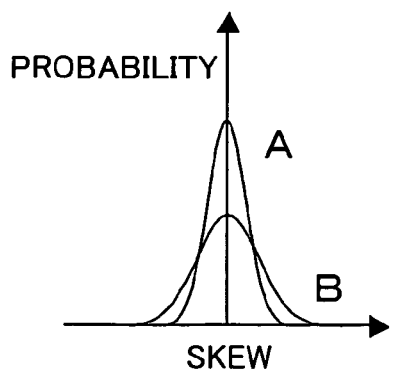
FIG. 2C is a graph illustrating skew distributions occurring between the clock signal paths of FIG. 2B.

Paths on which skews having the skew distribution A and the skew distribution B occur are extracted and illustrated in FIG. 2B. When the distribution A and the distribution B are compared, the distribution A has a higher degree of sharing two paths than that of the distribution B, so that the distribution A has a higher correlation in delay between the paths than that of the distribution B. This is because there is not an influence of an in-chip variation on a shared path portion, i.e., there is an influence of an in-chip variation only on a path portion which is not shared. As a result, the skew distribution A has a smaller skew distribution standard deviation σ than that of the skew distribution B as can be expected from expression (6). Therefore, as illustrated in FIG. 2C, in the case of the clock tree circuit, there are two skew distributions having different variation widths.

Thus, the clock skew classifying step S1 specifies the type of a skew distribution, taking into consideration the connection form (topology) of a clock tree circuit, and associates each pair of clock signal paths with a skew type. In the case of the clock tree circuit of FIG. 2A, a correspondence table as illustrated in, for example, Table 1 can be prepared.

TABLE 1

| Output | Output | Skew Distribution |
|--------|--------|-------------------|
| OUT1   | OUT2   | A                 |
| OUT1   | OUT3   | B                 |
| OUT1   | OUT4   | B                 |
| OUT2   | OUT3   | B                 |
| OUT2   | OUT4   | B                 |
| OUT3   | OUT4   | A                 |

(Clock Skew Distribution Calculating Step S2)

Next, in the clock skew distribution calculating step S2, a clock tree circuit skew distribution of each type classified in the clock skew classifying step S1 is calculated. In the case of the clock tree circuit of FIG. 2A, the two types of the skew distributions A and B are calculated. Since the skew distribution needs to be calculated as a statistical amount, a Monte Carlo analysis technique or the like in which a circuit simulation is performed, taking into consideration both an inter-chip variation component and an in-chip variation component (see, for example, "JP 2005-259107 A") can be applied to the calculation. In this case, the effect that a variation in delay due to the in-chip variation is averaged along a clock signal path, is taken into consideration.

Skew distribution information calculated by the clock skew distribution calculating step S2 may be stored as data indicating distributions as illustrated in Table 2.

TABLE 2

| Skew Distribution | Average μ | Standard Deviation σ |
|---|---|---|
| A | 0 [ps] | 11 [ps] |
| B | 0 [ps] | 15 [ps] |

(Signal Path Classifying Step S3)

Next, in the signal path classifying step S3, a plurality of signal paths in the integrated circuit, which are to be driven by pairs of clock output terminals, are classified into the skew distribution types obtained in the clock skew classifying step S1, i.e., here, the skew distributions A and B.

Figure 3:
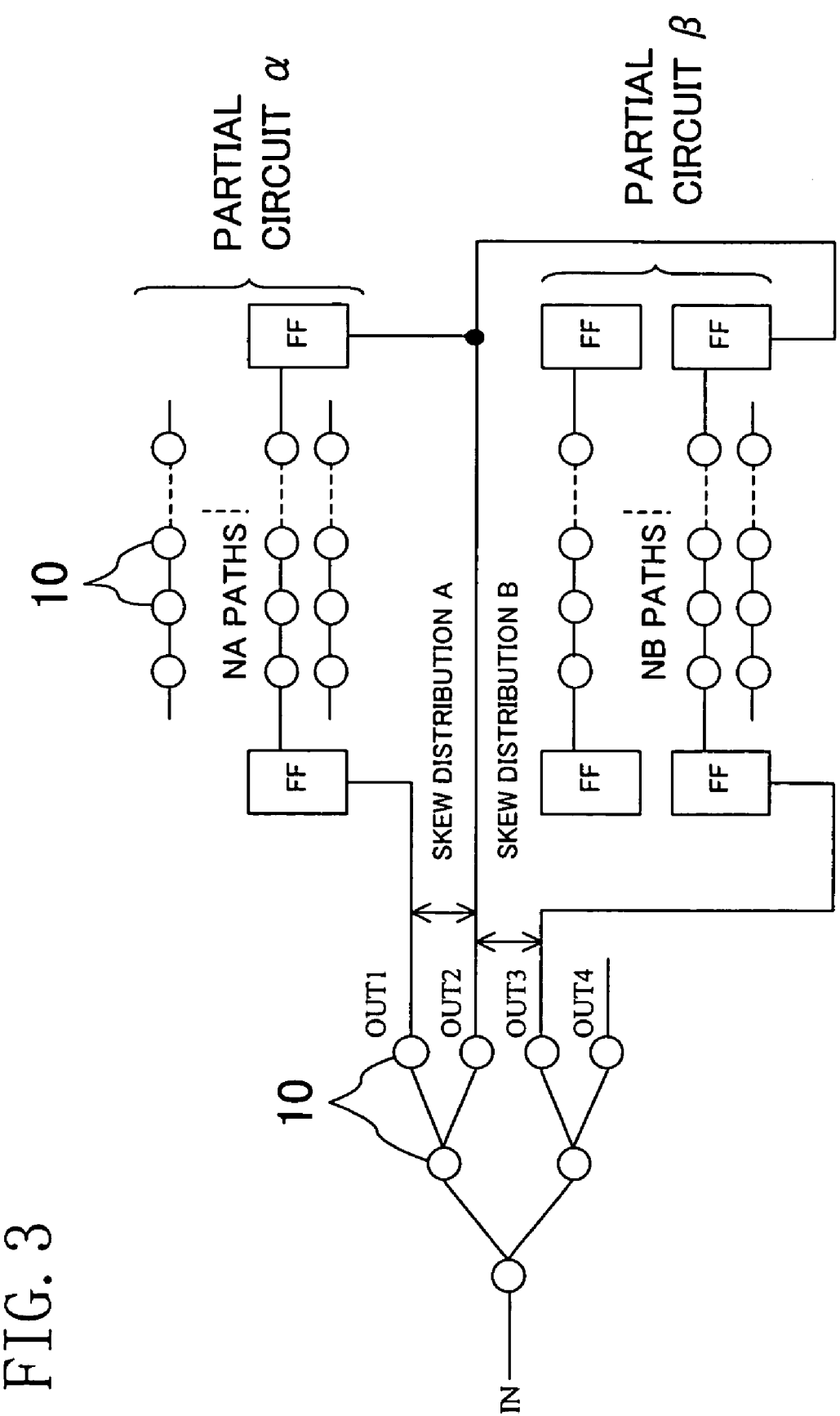
FIG. 3 is a circuit diagram illustrating signal path groups included in partial circuits connected to different clock output terminal pairs which are to be handled by the semiconductor integrated circuit timing verification method of the first embodiment of the present invention.

For example, as illustrated in FIG. 3, signal paths to be driven are extracted for each combination of a clock output terminal pair (clock signal pair) obtained from the clock output terminals OUT1 to OUT4. Specifically, assuming that there are only the two skew distributions A and B, a group of signal paths which are to be driven by a first clock output terminal pair having the skew distribution A between OUT1 and OUT2 of the clock output terminals OUT1 to OUT4 are extracted, and a circuit including the extracted signal path group is represented by a first partial circuit α. A group of signal paths which are to be driven by a second clock output terminal pair having the skew distribution B between OUT2 and OUT3 are extracted, and a circuit including the extracted signal path group is represented by a second partial circuit β.

It is here assumed that a signal path is not connected between terminal pairs other than these two clock output terminal pairs, i.e., between OUT1 and OUT3, between OUT1 and OUT4, between OUT2 and OUT4, and between OUT3 and OUT4. Note that a signal path refers to a signal path interposed between two flip-flop circuits FF. Here, the number of signal paths in the first partial circuit α is represented by NA, and the number of signal paths in the second partial circuit β is represented by NB. Therefore, in the exemplary integrated circuit of FIG. 3, a correspondence table as illustrated in Table 3 can be prepared.

TABLE 3

| Signal Path Number | Skew Distribution | Partial Circuit |
|---|---|---|
| 1 | A | α |
| 2 | A | α |
| 3 | B | β |
| 4 | A | α |
| 5 | B | β |

TABLE 3-continued

| Signal Path Number | Skew Distribution | Partial Circuit |
|---|---|---|
| 6 | B | β |
| ... | ... | ... |
| NA + NB | A | α |

(Signal Path Group Delay Distribution Calculating Step S4)

Typically, when a cycle time of a clock signal is assigned to a plurality of signal paths, a highest operating speed of an LSI is determined by a slowest signal path of the plurality of signal paths. Therefore, in the case of conventional design methods which assume that the signal path delay is handled as a fixed value (only a single value), but not as a statistical amount, and individual signal paths are independent, the operating speed of the whole LSI is assumed to be determined by a signal path having a largest delay (i.e., a critical path).

However, when the signal path delay is handled as a statistical amount so as to take a variation into consideration as in the first embodiment, it is necessary to obtain probability distributions of delays of all the signal paths so as to perform timing verification.

As indicated in the above-described Non-Patent Document, when an in-chip variation occurs, a probability that delays of a plurality of signal paths take a maximum value is different from a probability of a delay of one signal path.

Therefore, in the signal path group delay distribution calculating step S4, for each extracted partial circuit, a distribution of a probability of taking a maximum value among delays of all signal paths included in the partial circuit is calculated.

For example, when a delay distribution of a k-th signal path of N signal paths is represented by $D_k$, a maximum probability of a delay D of the whole partial circuit is obtained by the following expression (7). A Monte Carlo analysis technique or the like in which a circuit simulation is performed, taking into consideration both the inter-chip variation and the in-chip variation, can be applied to a method of calculating the statistical amount $D_k$, as in the clock skew distribution calculating step S2.

$$D = \text{Max}(D_1, D_2, \ldots, D_k, \ldots, D_N) \quad (7)$$

Figure 4A:
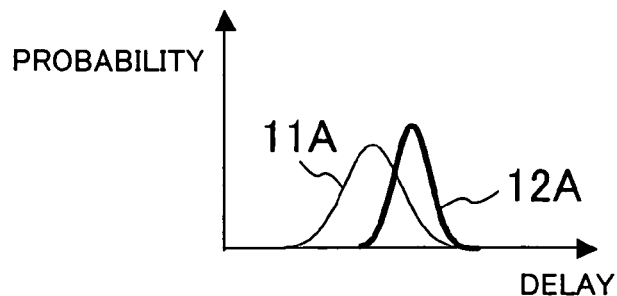
FIGS. 4A and 4B are graphs illustrating maximum delay probability distributions of partial circuits extracted by the semiconductor integrated circuit timing verification method of the first embodiment of the present invention.
Figure 4B:
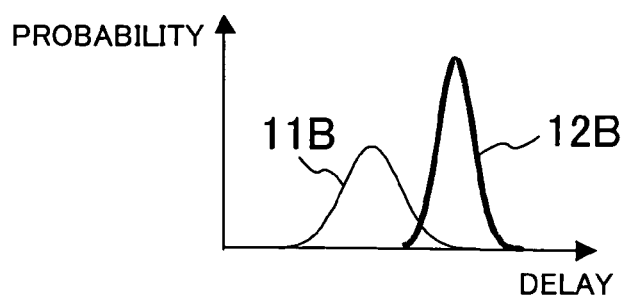

In FIGS. 4A and 4B, assuming that signal path delay distributions indicated with reference characters 11A and 11B are all the same, and the numbers of signal paths are NA<NB in FIG. 3, results ($D_\alpha$ and $D_\beta$) of statistical maximum values obtained for the first partial circuit α and the second partial circuit β, respectively, based on expression (7) are represented by reference characters 12A and 12B.

As illustrated in FIGS. 4A and 4B, the maximum probability distributions 12A and 12B of delays of the partial circuits α and β have average values and variances different from those of the distributions 11A and 11B of signal paths included in the partial circuits α and β. Also, regarding deviations of the maximum probability distributions of delays of the partial circuits α and β from the delay distributions of the signal paths, the deviation of the second partial circuit β having a larger number of signal paths is larger than that of the first partial circuit α.

The calculated maximum probability distribution information may be subjected to, for example, normal distribution approximation, and thereafter, the resultant data indicating a distribution as indicated in Table 4 may be stored.

TABLE 4

| Maximum Probability Distribution | Average μ | Standard Deviation σ |
|---|---|---|
| $D_\alpha$ | 1.8 [ns] | 50 [ps] |
| $D_\beta$ | 2.1 [ns] | 44 [ps] |

(Timing Verifying Step S5)

Next, in the timing verifying step S5, all the data so far obtained are collectively used to perform timing verification.

In FIG. 3, the first clock output terminal pair OUT1 and OUT2 corresponds to the skew distribution A according to the result of the clock skew classifying step S1. When the skew distribution A obtained in the clock skew distribution calculating step S2 and the maximum delay probability distribution $D_\alpha$ of the first partial circuit α obtained in the signal path group delay distribution calculating step S4 are substituted into the left side of expression (1), the left side of the following expression (8) is obtained. It is also confirmed that the inequality of expression (8) is established.

$$D_\alpha + A + T_{setup} \leq T_{cycle} \quad (8)$$

Similarly, the second clock output terminal pair OUT2 and OUT3 corresponds to the skew distribution B according to the result of the clock skew classifying step S1. A relationship of expression (9) in which the skew distribution B obtained in the clock skew distribution calculating step S2 and the maximum delay probability distribution $D_\beta$ of the second partial circuit β obtained in the signal path group delay distribution calculating step S4 are reflected, is verified.

$$D_\beta + B + T_{setup} \leq T_{cycle} \quad (9)$$

Figure 5A:
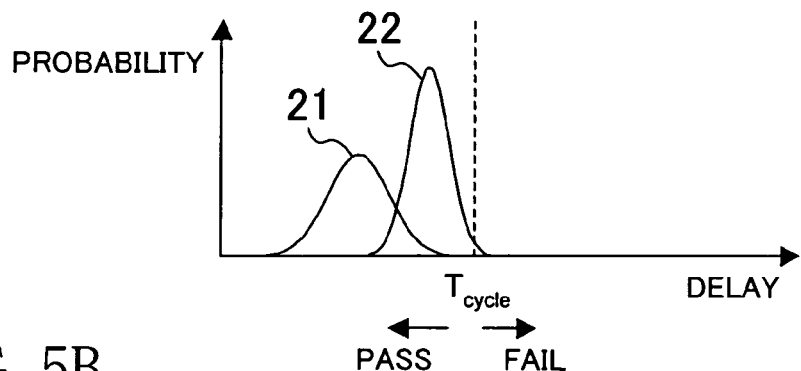
FIGS. 5A and 5B are graphs for explaining a setup time-side timing verifying step of the semiconductor integrated circuit timing verification method of the first embodiment of the present invention.

FIG. 5A illustrates probability distributions on the left sides of expressions (8) and (9). Here, a graph indicated with reference character 21 is of the left side of expression (8), and a graph indicated with reference character 22 is of the left side of expression (9). Therefore, for example, timing verification can be performed by determining whether or not a point three times the standard deviation away from the distribution average of the left side falls within the clock cycle (a pass region in FIG. 5A).

Figure 5B:
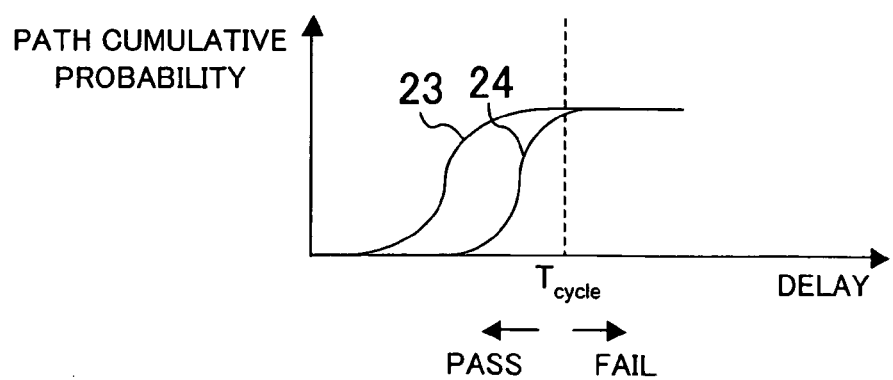

Alternatively, as illustrated in FIG. 5B, a cumulative probability of the left side of expression (8) indicated with reference character 23 and a cumulative probability of the left side of expression (9) indicated with reference character 24 may be obtained, and a probability which does not fall within the clock cycle may be determined using a reference. Thereby, timing verification can also be performed.

Figure 6:
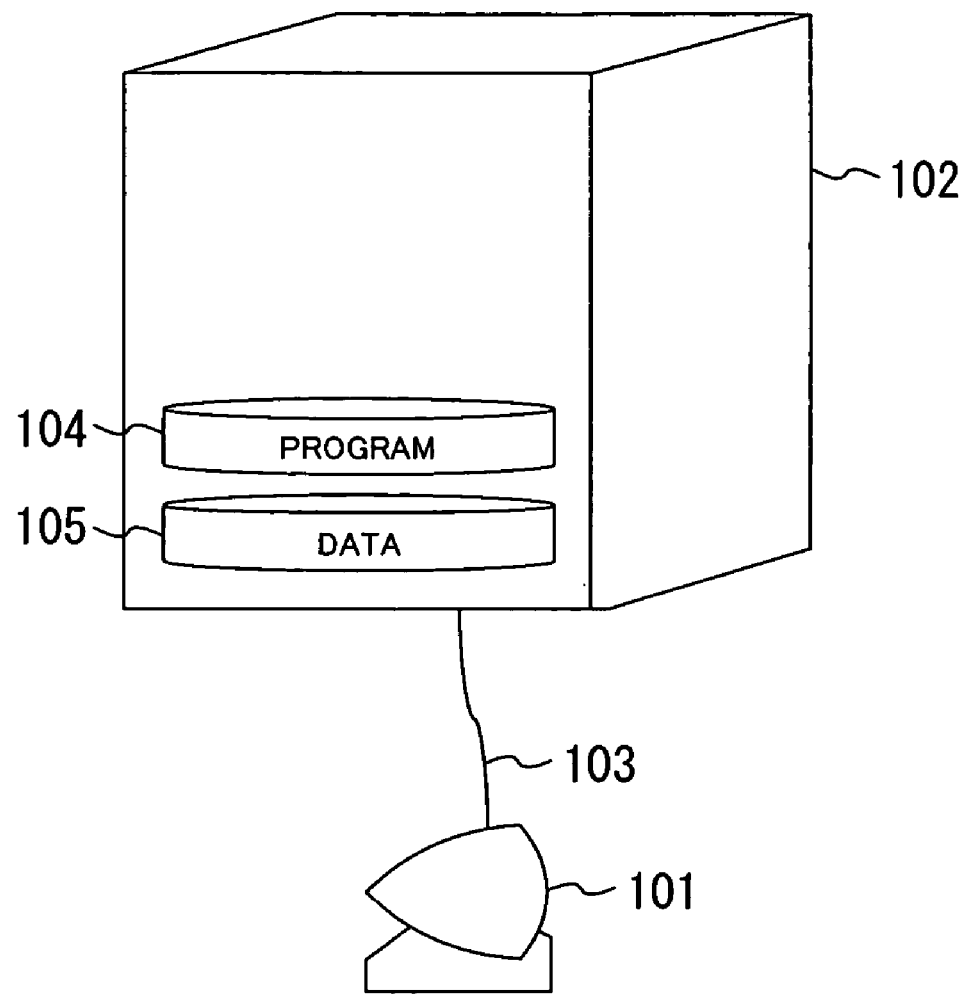
FIG. 6 is a schematic diagram illustrating an exemplary computer system which implements the semiconductor integrated circuit timing verification method of the first embodiment of the present invention.

FIG. 6 schematically illustrates an exemplary computer system in which the semiconductor integrated circuit timing verification method of the first embodiment is implemented. As illustrated in FIG. 6, a terminal computer 101 is connected via a network 103 to a main computer 102.

The terminal computer 101 and the main computer 102 may have a general configuration including a CPU (central processing unit), a RAM (random access memory), a ROM (read only memory), a hard disk device, an interface device, and the like, and will not be described in detail. A program 104 which implements the steps of FIG. 1 and data 105 required to execute the program, are stored in a storage device of the main computer 102.

When the user operates the terminal computer 101 to instruct the main computer 102 to execute analysis, timing verification is performed on the main computer 102 in accordance with the program 104 which implements steps S1 to S5 of FIG. 1. Thereafter, the user accesses the result of the verification from the terminal computer 101 via the network 103, to reference the verification result which is output to an output device or the like.

Figure 7A:
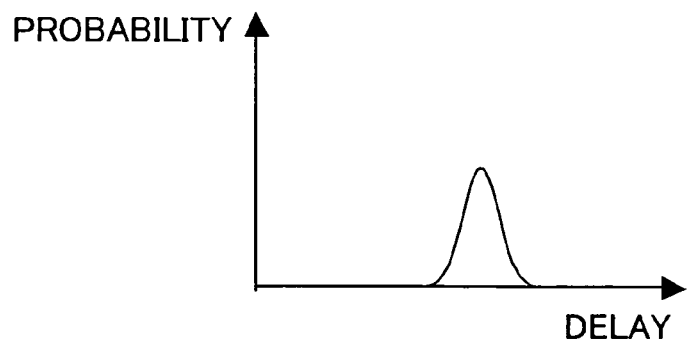
FIG. 7A is a graph illustrating a delay distribution of each signal path when assuming a histogram of signal path delays illustrated in FIG. 7B, in a signal path group delay distribution calculating step of the semiconductor integrated circuit timing verification method of the first embodiment of the present invention.
Figure 7B:
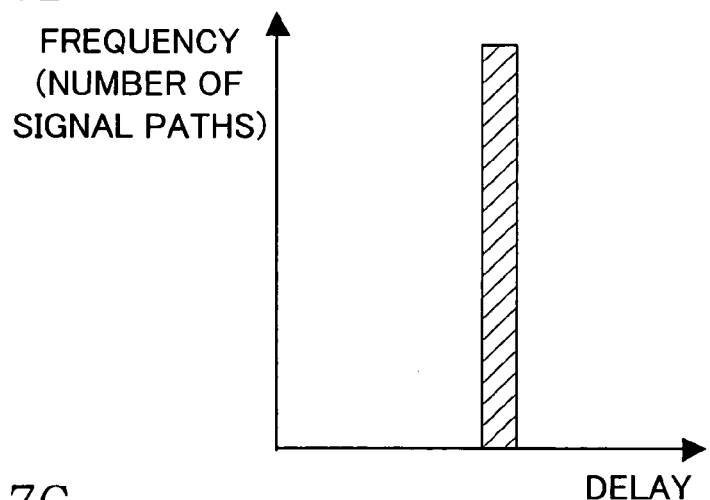
FIG. 7C is a graph illustrating a delay distribution of each signal path when assuming a histogram of signal path delays illustrated in FIG. 7D, in the signal path group delay distribution calculating step of the semiconductor integrated circuit timing verification method of the first embodiment of the present invention.

In the signal path group delay distribution calculating step S4 of the first embodiment, as described above, for the sake of simplicity, it is assumed that signal path delay distributions are the same between signal paths. Specifically, it is assumed that a plurality of signal paths having the same delay distribution as illustrated in FIG. 7A are present as illustrated with a histogram in FIG. 7B. However, in actual LSIs, it is not often that a plurality of signal paths have the same delay distribution, and typically, a delay distribution varies between signal paths. In general, frequencies of signal paths having different delay distributions as illustrated in FIG. 7C have a distribution as illustrated in FIG. 7D.

Figure 7C:
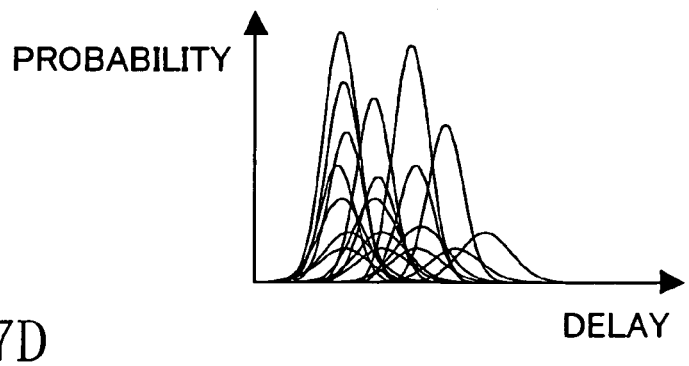
Figure 7D:
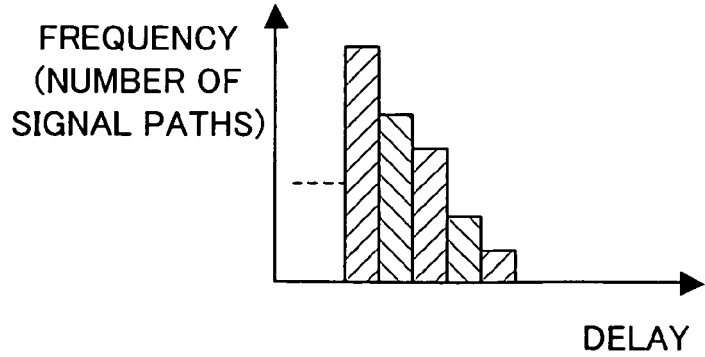

Therefore, as a first variation of the first embodiment, a signal path group as illustrated in FIGS. 7C and 7D may be handled in the signal path group delay distribution calculating step S4. Specifically, when expression (7) is used to perform calculation, a delay distribution having a different average and variance between each signal path may be assigned to the delay distribution $D_k$ of each signal path.

Although the setup time $T_{setup}$ in expression (1) is handled as a fixed value in the first embodiment, the setup time $T_{setup}$ may be handled as a statistical amount (second variation).

Figure 14:
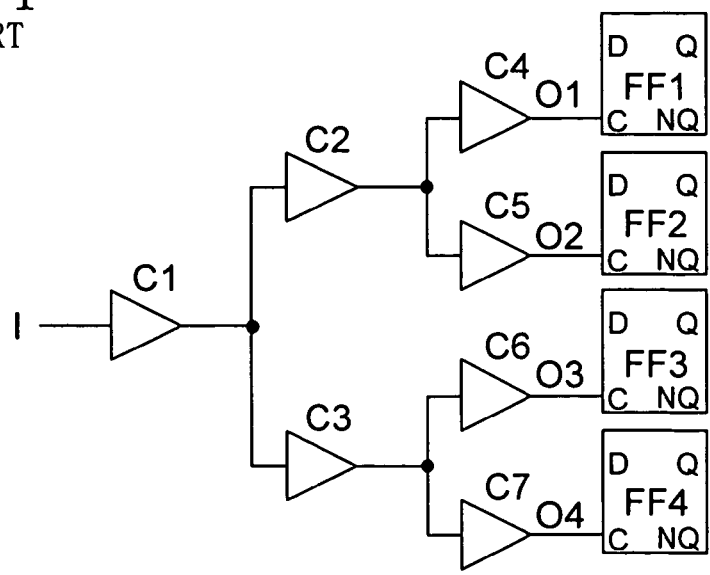
FIG. 14 is a circuit diagram for explaining a conventional clock tree circuit.
Figure 15:
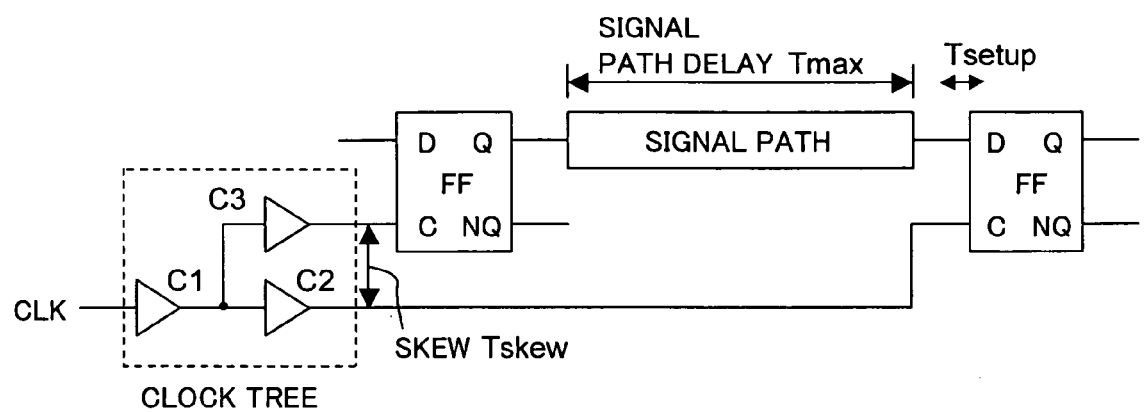
FIG. 15 is a circuit diagram for explaining a conventional clock tree circuit including a signal path.

Although delays occurring in the flip-flop circuits FF1 to FF4 of FIG. 14 themselves (e.g., a delay occurring from a clock input terminal C to a positive-phase output terminal Q of a flip-flop circuit) are not discussed in the first embodiment, the delay in the flip-flop circuit itself may be included in either the fixed value or the statistical amount.

In FIG. 1, steps S1, S2, S3, S4 and S5 do not necessarily need to be executed in this order. For example, after step S1, step S2 and step S3 may be performed in parallel. Note that, when the type of a skew distribution cannot be determined only based on the circuit topology of a clock circuit, a skew distribution may be previously calculated for each clock output terminal pair, i.e., step S2 may be performed earlier than step S1, and a skew may be classified based on the result of step S2.

Although the clock tree circuit has a connection form (topology) having a tree shape and a binary tree structure in the first embodiment as illustrated in FIGS. 2A and 14, the present invention is not limited to this.

In the first embodiment, a variation in propagation of a clock signal is assumed to be caused during manufacture. In fact, circuit characteristics may also vary due to an operating environment factor, such as a voltage, a temperature or the like. Therefore, the following method is effective so as to take into consideration factors other than those during manufacture as well.

Initially, when each signal path delay distribution is obtained by circuit simulation or the like, a manufacture variation is given while setting conditions under which, for example, delays at a lowest voltage and a highest temperature are maximum, and based on this, a maximum delay probability distribution $T_{path}$ of each partial circuit is obtained. Thereafter, also in a skew distribution $T_{skew}$, conditions under which delays at a lowest voltage and a highest temperature are maximum are set, and setup time-side timing verification is performed using the following expression (10).

$$T_{path(max)VDDmin, Tjmax} + T_{skew\backslash VDDmin, Tjmax} + T_{setup} \leq T_{cycle} \quad (10)$$

Hold time-side timing verification is similarly performed in accordance with expression (11) while setting conditions under which, for example, delays at a highest voltage and a lowest temperature are minimum. In this method, a series of steps S1 to S5 of the first embodiment can be applied as they are, only if the voltage and the temperature conditions are set.

$$T_{path(min)|VDDmax, Tjmin} - T_{skew|VDDmax, Tjmin} \geq T_{hold} \quad (11)$$

When the voltage and the temperature are not uniform in a chip, different coefficients may be introduced with respect to $T_{path}$ and $T_{skew}$, respectively, so as to separately set influences of the voltage and the temperature, as indicated with expressions (12) and (13).

$$K_V K_T T_{path(max)} + S_V S_T T_{skew} + T_{setup} \leq T_{cycle} \quad (12)$$

$$K'_V K'_T T_{path(min)} - S'_V S'_T T_{skew} \geq T_{hold} \quad (13)$$

Here, $K_V$ and $K_T$ are coefficients which have influences of the voltage and the temperature on the maximum delay probability distribution of a partial circuit during setup time-side verification, and $K'_V$ and $K'_T$ are coefficients which have influences of the voltage and the temperature on the minimum delay probability distribution of a partial circuit during hold time-side verification. $S_V$ and $S_T$ are coefficients which have influences of the voltage and the temperature on the skew distribution during setup time-side verification, and $S'_V$ and $S'_T$ are coefficients which have influences of the voltage and the temperature on the skew distribution during hold time-side verification. Also in this case, for $T_{path}$ and $T_{skew}$, a series of steps S1 to S5 of the first embodiment can be applied as they are.

In the first embodiment, a maximum signal path delay or a condition under which a delay is maximum is used for setup time margin verification. In a fourth embodiment described below, a minimum signal path delay or a condition under which a delay is minimum is used for hold time margin verification. Conversely, a minimum signal path delay can be used for setup time margin verification and a maximum signal path delay is used for hold time margin verification.

Note that characteristics of a clock circuit which vary due to an influence of a manufacture variation or the like are not limited to a clock signal delay, and may include a waveform (i.e., a transition time), a through rate, a rising time, and a falling time of a clock signal. A variation in the clock signal waveform also has an influence on a delay of a signal path which receives the clock signal. Therefore, when a skew distribution is calculated, a variation in the clock signal waveform may be previously obtained, and thereafter, a delay distribution of each signal path may be calculated while referencing the variation in the clock signal waveform.

For example, in the case of the clock tree circuit of FIG. 14, variations in clock signal waveforms in the clock input terminals C of the flip-flop circuit FF1 and the like are previously approximated using a normal distribution. Next, when delay distributions of the signal paths are calculated, the flip-flop circuit FF1 and the like may be connected before signal paths to be verified, and clock signal waveforms input to the clock input terminals C of the flip-flop circuit FF1 and the like thus connected, may be calculated by giving a variation approximated using a normal distribution.

As described above, according to the first embodiment, the non-uniformity of skew distributions due to a clock tree structure having a manufacture variation including an in-chip variation component is obtained, and a partial circuit driven by a clock output terminal pair having each skew distribution is extracted from the whole circuit of a chip.

Next, a maximum delay distribution representing the partial circuit is obtained from delay distributions of a plurality of signal paths included in the extracted partial circuit, and a corresponding skew distribution and the maximum delay distribution can be used to perform setup time-side timing verification.

Thereby, as compared to the conventional art, timing verification can be stochastically performed, taking into consideration a variation, such as a manufacture variation or the like. In addition, more reliable verification can be performed, simultaneously taking into consideration a property of a clock circuit and a property of circuit design.

Second Embodiment

Hereinafter, a timing verification method according to a second embodiment of the present invention will be described with reference to the drawings.

In the first embodiment, as illustrated in FIG. 3, the case where there are a plurality of signal paths only between the first clock output terminal pair OUT1 and OUT2 and between the second clock output terminal pair OUT2 and OUT3, corresponding to the inherent skew distributions A and B, respectively, has been described.

Figure 8A:
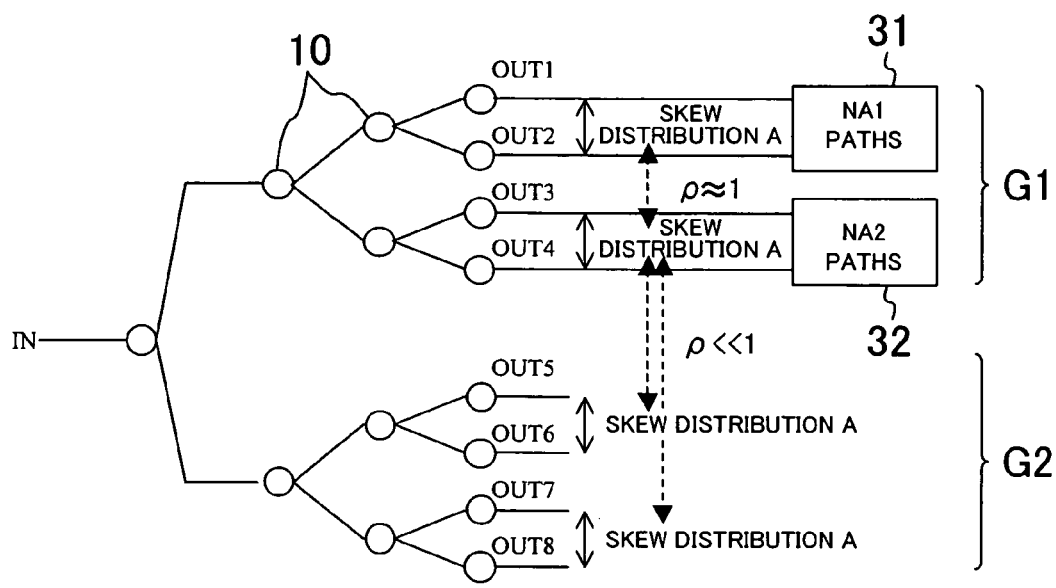
FIG. 8A is a diagram illustrating a clock tree circuit which is to be handled by a semiconductor integrated circuit timing verification method according to a second embodiment of the present invention, and partial circuits connected to clock output terminal pairs having the same skew distribution.

Therefore, as illustrated in FIG. 8A, when a clock tree circuit has a larger number of branches and a larger number of clock signal output terminals than those of FIG. 2A, the second embodiment is enabled.

It is assumed that a clock signal is supplied from a clock tree circuit to all elements (circuit cells 10) on a chip. In this case, it is also assumed that a correlation between variations of elements close to each other is high, and the correlation decreases with a distance between elements.

As illustrated in FIG. 8A, in the second embodiment, for example, it is assumed that: a first partial circuit 31 having NA1 signal paths is connected between a first clock output terminal pair OUT1 and OUT2 which are so close to each other that it can be assumed that the terminals have the same or equivalent skew distribution A, and a correlation coefficient between the skew distributions A is substantially 1 ($\rho \approx 1$); and a second partial circuit 32 having NA2 signal paths is connected between a second clock output terminal pair OUT3 and OUT4. Here, the clock output terminals OUT1 to OUT4 belong to a first group G1, and clock output terminals OUT5 to OUT8 belong to a second group G2.

Figure 8B:
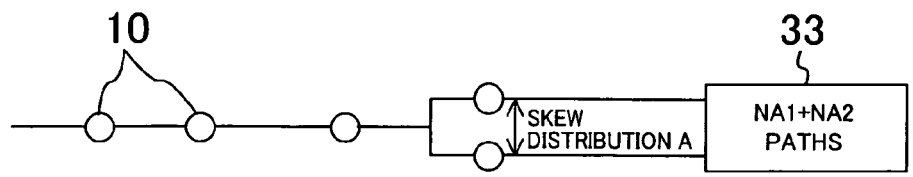
FIG. 8B is a circuit diagram in which the clock output terminal pairs of FIG. 8A are virtually collected into one, and the corresponding partial circuits are collected into one.

Thus, in the signal path classifying step S3 of FIG. 1, two partial circuits are classified into the first group G1 as illustrated in FIG. 8B, and a third partial circuit 33 including a group of (NA1+NA2) signal paths is assumed. The third partial circuit 33 is assumed to be driven by a virtual clock output terminal pair having the skew distribution A. In step S4 and thereafter in FIG. 1, processes similar to those of the first embodiment can be performed.

In contrast to this, in FIG. 8A, even when skew distributions between the third clock output terminal pair OUT5 and OUT6 and between the fourth clock output terminal pair OUT7 and OUT8 (these terminals are grouped into the second group G2) are the distribution A which is the same as that of the group G1, the clock output terminal pair included in the second group G2 and the clock output terminal pair included in the first group G1 are separated at a spatial distance on a chip, so that a correlation in skew distribution between the first group G1 and the second group G2 is weak ($\rho \ll 1$).

Although the case where there are two groups has been described in the second embodiment, the number of groups can be arbitrarily determined. Specifically, the number of groups can be increased to the number of clock output terminal pairs. Also, the same is true of the skew distribution B which is different from the skew distribution A.

Thus, according to the second embodiment, an effect similar to that of the first embodiment is obtained, and in addition, by grouping partial circuits into the types of skew distributions having a strong correlation, timing verification can be more easily and efficiently performed.

Third Embodiment

Hereinafter, a timing verification method according to a third embodiment of the present invention will be described with reference to the drawings.

Figure 9:
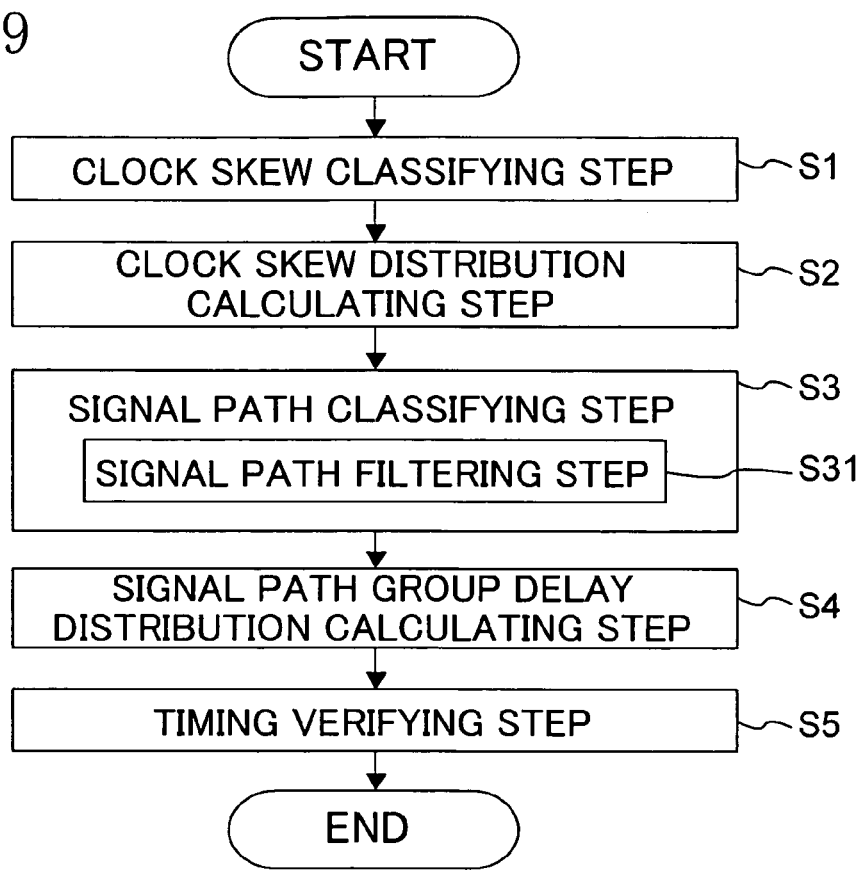
FIG. 9 is a step flow diagram illustrating a semiconductor integrated circuit timing verification method according to a third embodiment of the present invention.

FIG. 9 illustrates a step flow of the timing verification method of the third embodiment of the present invention for a semiconductor integrated circuit. As illustrated in FIG. 9, the third embodiment is different from the first embodiment in that the signal path classifying step S3 includes a signal path filtering step S31. Therefore, here, only the signal path filtering step S31 will be described.

(Signal Path Classifying Step S3)

As illustrated in FIG. 9, in the signal path classifying step S3, a plurality of signal paths in an integrated circuit driven by clock output terminal pairs having skew distributions are classified into the skew distribution types obtained in the clock skew classifying step S1. Note that the signal path classifying step S3 of the third embodiment is different from that of the first embodiment as follows.

Initially, as described above, in the signal path group delay distribution calculating step S4 after the signal path classifying step S3, a maximum delay is statistically calculated. In the calculation, a signal path delay is substantially equal to a cycle time ($T_{cycle}$ in expression (1)), and as a larger number of signal paths on which a large influence of an in-chip variation component remains are included at output ends of the signal paths, a maximum delay distribution is more significantly deviated from the original distribution.

The in-chip variation component is a variation which randomly occurs in a chip, and has a property that an influence on a delay is averaged along a signal path. The degree of the averaging is substantially determined, depending on a length of the signal path (e.g., the number of gates (also called the number of logical steps or a logical depth)). Specifically, approximation which calculates an average in inversely proportional to the square root of the number of gates ($=1/\sqrt{\text{the number of gates}}$). The case where the standard deviation of a random variation is attenuated by the averaging approximation to 20% ($=\frac{1}{5} \times 100\%$) of that when only one gate is present, may be used as a guidance. In the case of this example, the number of gates on which a limitation is put is 25.

Thereby, the longer the signal path, the higher the degree of the averaging, i.e., the smaller the proportion of the in-chip variation component in the signal path delay distribution, resulting in a decrease in influence of a signal path in calculation of a maximum delay in the signal path group delay distribution calculating step S4.

Assuming that a signal path delay is significantly small compared to a cycle time, even if a certain amount of in-chip variation component remains, the influence of the in-chip variation component when a maximum delay is calculated is small.

In addition, generally, the number of gates varies between signal paths even when a delay is substantially equal to a cycle time in the signal paths.

Therefore, in the third embodiment, in the signal path filtering step S31 included in the signal path classifying step S3, a limitation is put on the signal path delay and the number of gates so that only a signal path(s) which has a delay which is substantially equal to a cycle time and the number of gates which is a limited number or less are to be classified.

After the signal path classification is limited, the signal path group delay distribution calculating step S4 and the following steps are similar to those of the first embodiment.

As described above, according to the third embodiment, a signal path(s) which are to be used to calculate a maximum delay distribution representing a partial circuit is selected while putting a limitation on the number of signal paths, thereby making it possible to reduce the number of calculation steps in the signal path group delay distribution calculating step S4.

Fourth Embodiment

Hereinafter, a timing verification method according to a fourth embodiment of the present invention will be described with reference to the drawings.

Figure 10:
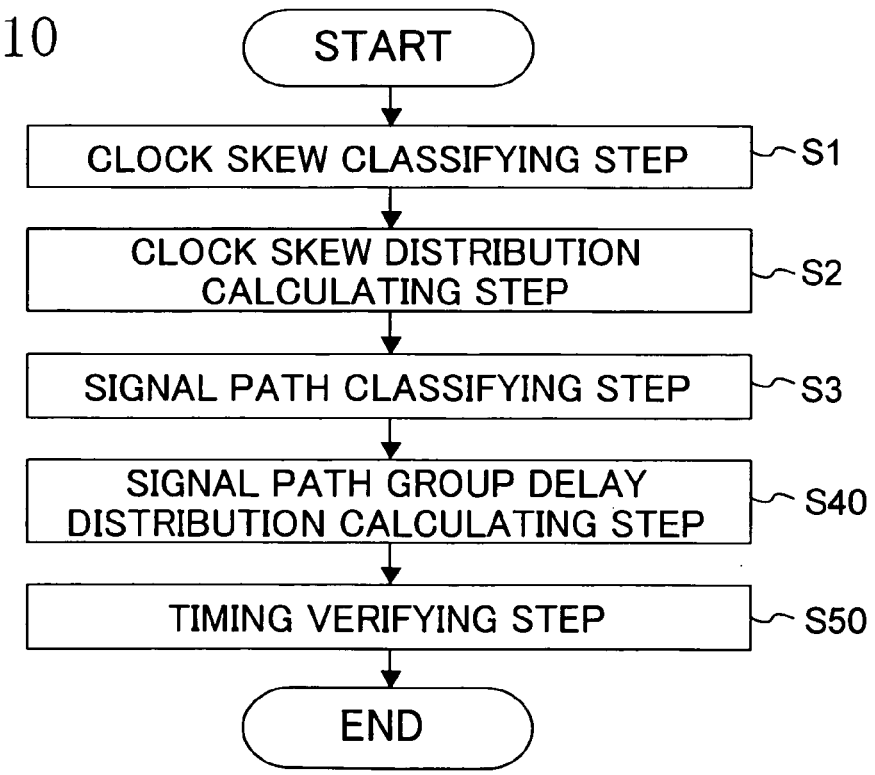
FIG. 10 is a step flow diagram illustrating a semiconductor integrated circuit timing verification method according to a fourth embodiment of the present invention.

FIG. 10 illustrates a step flow of the timing verification method of the fourth embodiment of the present invention for a semiconductor integrated circuit. As illustrated in FIG. 10, the fourth embodiment is different from the first embodiment in a signal path group delay distribution calculating step S40 and a timing verifying step S50. Therefore, here, only the signal path group delay distribution calculating step S40 and the timing verifying step S50 in which only a minimum delay probability distribution among delay probability distributions of signal paths is handled will be described.

(Signal Path Group Delay Distribution Calculating Step S40)

As described in the first embodiment, when a manufacture variation includes an in-chip variation component, a probability that delays of a plurality of signal paths take a minimum value is different from a probability of a delay of one signal path.

Therefore, in the signal path group delay distribution calculating step S40 of the fourth embodiment, for each extracted partial circuit, a distribution of a probability of taking a minimum value among delays of all signal paths included in the partial circuit is calculated.

For example, when a delay distribution of a k-th signal path among N signal paths is represented by $D_k$, a minimum probability of a delay D of the whole partial circuit is obtained by the following expression (14). A Monte Carlo analysis technique or the like in which a circuit simulation is performed, taking into consideration both the inter-chip variation and the in-chip variation, can be applied to a method of calculating the statistical amount $D_k$, as in the clock skew distribution calculating step S2.

$$D = \text{Min}(D_1, D_2, \ldots, D_k, \ldots, D_N) \quad (14)$$

Figure 11A:
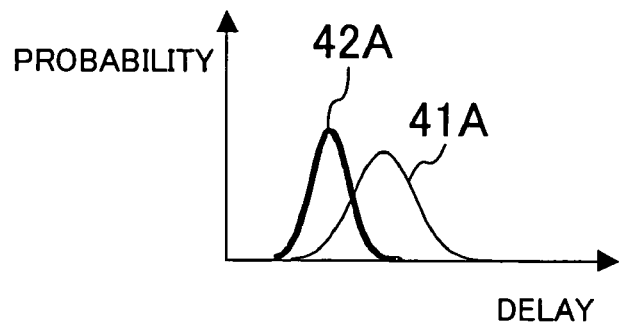
FIGS. 11A and 11B are graphs illustrating minimum delay probability distributions of partial circuits extracted by the semiconductor integrated circuit timing verification method of the fourth embodiment of the present invention.
Figure 11B:
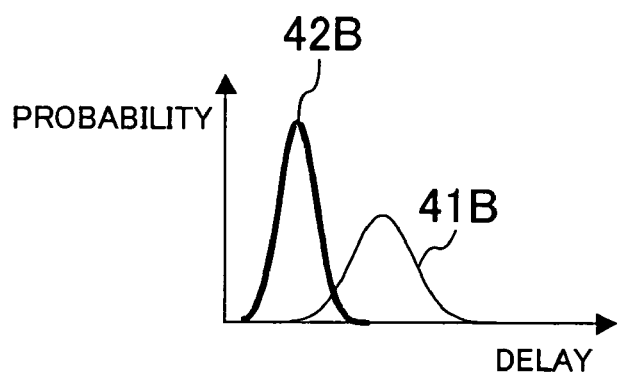

In FIGS. 11A and 11B, assuming that signal path delay distributions indicated with reference characters 41A and 41B are all the same, and the numbers of signal paths are NA<NB in FIG. 3, results ($D_\alpha$ and $D_\beta$) of statistical minimum values obtained for the first partial circuit α and the second partial circuit β, respectively, based on expression (14) are represented by reference characters 42A and 42B.

As illustrated in FIGS. 11A and 11B, the minimum probability distributions 42A and 42B of delays of the partial circuits α and β have average values and variances different from those of the distributions 41A and 41B of signal paths included in the partial circuits α and β. Also, regarding deviations of the minimum probability distributions of delays of the partial circuits α and β from the delay distributions of the signal paths, the deviation of the second partial circuit β having a larger number of signal paths is larger than that of the first partial circuit α.

The calculated minimum probability distribution information may be subjected to, for example, normal distribution approximation, and thereafter, the resultant data may be stored as in the first embodiment.

(Timing Verifying Step S50)

Next, in the timing verifying step S50, all the data so far obtained are collectively used to perform timing verification.

In FIG. 3, the first clock output terminal pair OUT1 and OUT2 corresponds to the skew distribution A according to the result of the clock skew classifying step S1. When the skew distribution A obtained in the clock skew distribution calculating step S2 and the minimum delay probability distribution $D_\alpha$ of the first partial circuit α obtained in the signal path group delay distribution calculating step S40 are substituted into the left side of expression (2), the left side of the following expression (15) is obtained. It is also confirmed that the inequality of expression (15) is established.

$$D_\alpha - A \geq T_{hold} \quad (15)$$

Similarly, the second clock output terminal pair OUT2 and OUT3 corresponds to the skew distribution B according to the result of the clock skew classifying step S1. A relationship of expression (16) in which the skew distribution B obtained in the clock skew distribution calculating step S2 and the minimum delay probability distribution $D_\beta$ of the second partial circuit β obtained in the signal path group delay distribution calculating step S40 are reflected, is verified.

$$D_\beta - B \geq T_{hold} \quad (16)$$

Figure 12:
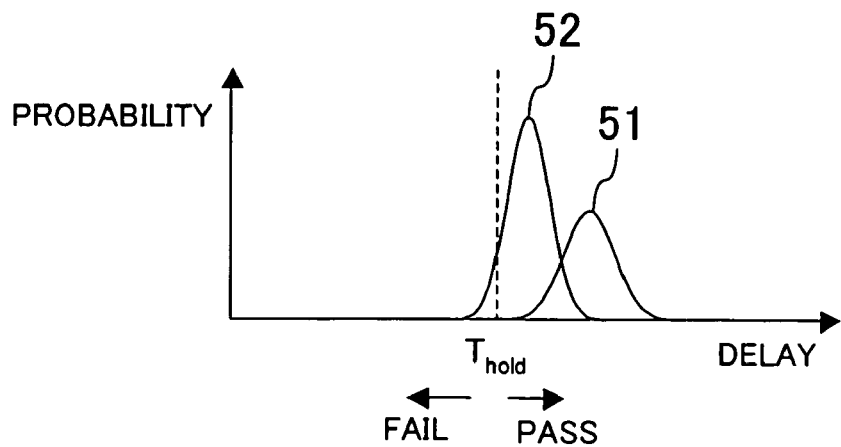
FIG. 12 is a graph for explaining a hold time-side timing verifying step of the semiconductor integrated circuit timing verification method of the fourth embodiment of the present invention, illustrating probability distributions on the left sides of expressions (15) and (16).
Figure 13:
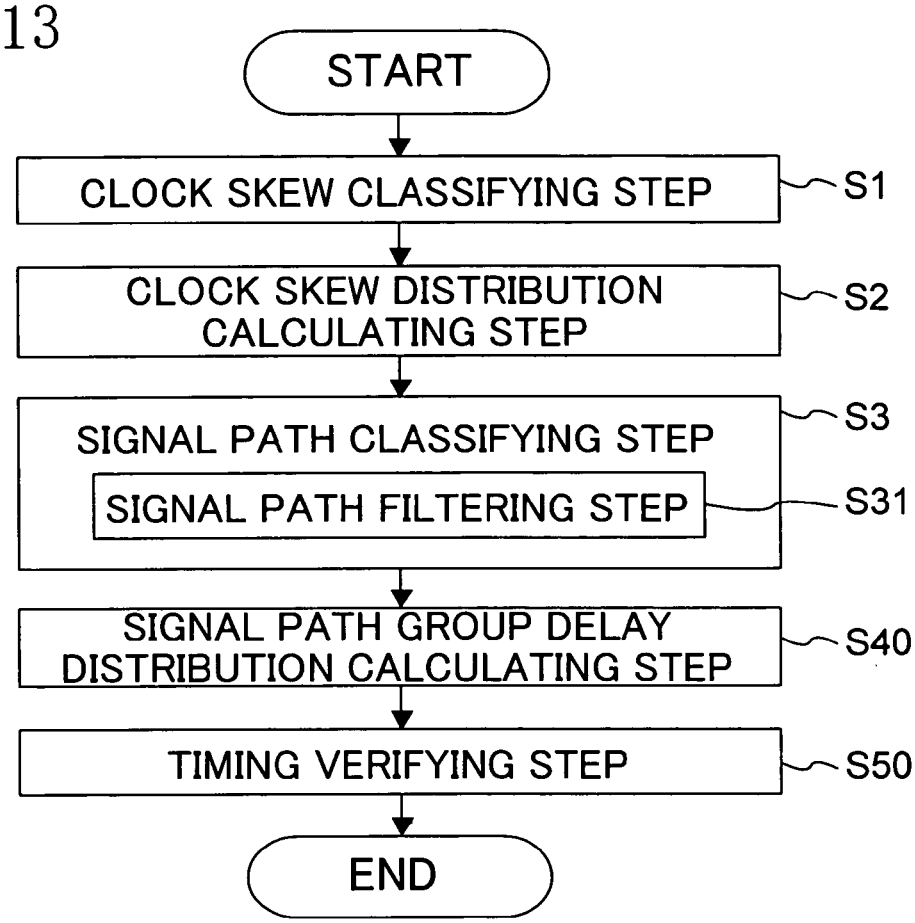
FIG. 13 is a step flow diagram illustrating a semiconductor integrated circuit timing verification method according to a variation of the fourth embodiment of the present invention.

FIG. 12 illustrates probability distributions on the left sides of expressions (15) and (16). Here, a graph indicated with reference character 51 is of the left side of expression (15), and a graph indicated with reference character 52 is of the left side of expression (16). Therefore, for example, timing verification can be performed by determining whether or not a point three times the standard deviation away from the distribution average of the left side falls within the hold time (a pass region in FIG. 12).

As illustrated in FIG. 5B, a cumulative probability of the left side of each of expressions (15) and (16) is obtained, and a probability which does not fall within the hold time is determined using a reference, i.e., timing verification can be performed.

As described above, according to the fourth embodiment, the non-uniformity of skew distributions due to a clock tree structure having a manufacture variation including an in-chip variation component is obtained, and a partial circuit driven by a clock output terminal pair having each skew distribution is extracted from the whole circuit of a chip. Next, a minimum delay distribution representing the partial circuit is obtained from delay distributions of a plurality of signal paths included in the extracted partial circuit, and a corresponding skew distribution and the minimum delay distribution can be used to perform hold time-side timing verification.

Thereby, as compared to the conventional art, timing verification can be stochastically performed, taking into consideration a variation, such as a manufacture variation or the like. In addition, more reliable verification can be performed, simultaneously taking into consideration a property of a clock circuit and a property of circuit design.

Variation of Fourth Embodiment

In the fourth embodiment, a minimum delay is statistically calculated in the signal path group delay distribution calculating step S40. In the calculation, a signal path delay is substantially equal to a minimum, and as a larger number of signal paths on which a large influence of an in-chip variation component remains are included at output ends of the signal paths, a minimum delay distribution is more significantly deviated from the original distribution.

The in-chip variation component is a variation which randomly occurs in a chip, and has a property that an influence on a delay is averaged along a signal path. The degree of the averaging is substantially determined, depending on a length of the signal path (e.g., the number of gates (also called the number of logical steps or a logical depth)).

Specifically, the longer the signal path, the higher the degree of the averaging, i.e., the smaller the proportion of the in-chip variation component in the signal path delay distribution, resulting in a decrease in influence of a signal path in calculation of a minimum delay in the signal path group delay distribution calculating step S40.

Assuming that a signal path delay is large, even if a certain amount of in-chip variation component remains, the influence of the in-chip variation component when a minimum delay is calculated is small.

In general, the number of gates varies between signal paths even when a delay is substantially equal to the minimum in the signal paths. Therefore, in the variation of the fourth embodiment, in the signal path filtering step S31 included in the signal path classifying step S3, a limitation is put on the signal path delay and the number of gates so that only a signal path(s) which has a delay which is in the vicinity of the minimum and the number of gates which is a limited number or less are to be classified.

After the signal path classification is limited, the signal path group delay distribution calculating step S40 and the following steps are similar to those of the fourth embodiment.

According to the variation, a signal path(s) which are to be used to calculate a minimum delay distribution representing a partial circuit is selected while putting a limitation on the number of signal paths, thereby making it possible to reduce the number of calculation steps in the signal path group delay distribution calculating step S40.

Note that the fourth embodiment or the variation thereof can be implemented in combination with any one of the first to third embodiments.

As described above, the timing verification method for a semiconductor integrated circuit of the present invention can verify a state of a timing margin with high precision from various skew distributions occurring in a clock circuit and a statistical delay distribution of a signal path group, and is useful for a design method for a semiconductor integrated circuit, and the like.

What is claimed is:

1. A method for performing timing verification for a semiconductor integrated circuit,
    wherein the semiconductor integrated circuit comprises:
        a clock circuit configured to output a plurality of clock signals, and an integrated circuit including a plurality of signal paths to which any of the plurality of clock signals output from the clock circuit is supplied, and wherein the timing verification is performed based on variations in the plurality of clock signals in the semiconductor integrated circuit, the method comprising the steps of:

(a) obtaining a plurality of statistical clock skews by statistically calculating a clock skew occurring between each pair of any clock signals of the plurality of clock signals;

(b) extracting from the integrated circuit a partial circuit driven by a clock signal pair in which one of the plurality of statistical clock skews occurs;

(c) calculating a first statistical timing characteristic of signal paths included in the extracted partial circuit;

(d) obtaining at least one of a maximum value and a minimum value of the calculated first statistical timing characteristic as a second statistical timing characteristic; and (e) performing timing verification for the signal paths included in the extracted partial circuit using the obtained second statistical timing characteristic.

2. The method of claim 1, wherein:

in the step (c), a delay probability distribution of each of the signal paths is used as the first statistical timing characteristic;

in the step (d), a maximum delay probability distribution of all the signal paths included in the extracted partial circuit is used as the second statistical timing characteristic; and in the step (e), setup time margin timing verification or hold time margin timing verification is performed for the extracted partial circuit using the maximum delay probability distribution.

3. The method of claim 1, wherein:

in the step (c), a delay probability distribution of each of the signal paths is used as the first statistical timing characteristic;

in the step (d), a minimum delay probability distribution of all the signal paths included in the extracted partial circuit is used as the second statistical timing characteristic; and in the step (e), setup time margin timing verification or hold time margin timing verification is performed for the extracted partial circuit using the minimum delay probability distribution.

4. The method of claim 1, wherein:

in the step (b), when statistical clock skew values occurring between the pairs of any clock signals are the same or equivalent, and a coefficient of correlation between the statistical clock skew values is substantially 1, a plurality of partial circuits connected to the clock signal pairs having the same or equivalent statistical clock skew value are collectively extracted.

5. The method of claim 1, wherein:

in the step (b), a limitation is put on a delay on each of the signal paths and the number of gates on each of the signal paths, and a partial circuit including a signal path satisfying the limitation is extracted from the integrated circuit.

6. The method of claim 1 further comprising:

(f) obtaining a variation in a signal waveform of each of the plurality of clock signals before the step (a), wherein, in the step (c), the first statistical timing characteristic in which the signal waveform variation of each of the clock signals is reflected, is calculated.

7. The method of claim 1, wherein:

in the step (a), the statistical clock skew is calculated, based on at least one factor of a manufacture variation, a voltage variation, and a temperature variation.

8. The method of claim 7, wherein:

the step (a) includes obtaining as a coefficient at least one factor of a manufacture variation, a voltage variation, and a temperature variation, and multiplying the statistical clock skew by the obtained coefficient.

9. The method of claim 1, wherein:

in the step (c), the first statistical timing characteristic is calculated, based on at least one factor of a manufacture variation, a voltage variation, and a temperature variation.

10. The method of claim 9, wherein:

the step (c) includes obtaining as a coefficient at least one factor of a manufacture variation, a voltage variation, and a temperature variation; and the step (d) includes multiplying the second statistical timing characteristic by the obtained coefficient.

11. A method for performing timing verification for a semiconductor integrated circuit, wherein the semiconductor integrated circuit comprises:
a clock circuit configured to output a plurality of clock signals, and
an integrated circuit including a plurality of signal paths to which any of the plurality of clock signals output from the clock circuit is supplied, and wherein the timing verification is performed based on variations in the plurality of clock signals in the semiconductor integrated circuit, the method comprising:

a clock skew classifying step (a) of specifying expected clock skew types based on a circuit topology of the clock circuit, and associating clock skews with clock signal pairs having the specified clock skews;

a clock skew distribution calculating step (b) of statistically calculating a probability distribution of a clock skew for each clock skew type;

a signal path classifying step (c) of extracting and classifying as a partial circuit a signal path driven by the clock signal pair from the integrated circuit for each probability distribution type of the clock skew;

a signal path group delay distribution calculating step (d) of calculating probability distributions of delays of all signal paths included in the partial circuit for each extracted partial circuit; and a timing verifying step (e) of performing timing verification based on at least one of a maximum delay and a minimum delay of the probability distributions of the delays of all the signal paths included in the extracted partial circuit, and the probability distribution of the clock skew.

* * * * *